(12) United States Patent
Li

(10) Patent No.: US 7,002,500 B2
(45) Date of Patent: Feb. 21, 2006

(54) CIRCUIT, APPARATUS AND METHOD FOR IMPROVED CURRENT DISTRIBUTION OF OUTPUT DRIVERS ENABLING IMPROVED CALIBRATION EFFICIENCY AND ACCURACY

(75) Inventor: Yingxuan Li, Cupertino, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/114,326

(22) Filed: Apr. 26, 2005

(65) Prior Publication Data

US 2005/0184896 A1    Aug. 25, 2005

Related U.S. Application Data

(63) Continuation of application No. 10/695,569, filed on Oct. 28, 2003, now Pat. No. 6,909,387, which is a continuation of application No. 10/132,246, filed on Apr. 25, 2002, now Pat. No. 6,674,377.

(51) Int. Cl.
*H03M 1/66* (2006.01)
(52) U.S. Cl. ......................... 341/144; 341/145
(58) Field of Classification Search ............... 341/144, 341/118, 120, 145, 119
See application file for complete search history.

(56) References Cited

U.S. PATENT DOCUMENTS

| | | | | |
|---|---|---|---|---|
| 3,877,023 A | * | 4/1975 | Spicer et al. | 341/118 |
| 4,870,629 A | * | 9/1989 | Swerlein et al. | 368/120 |
| 5,426,386 A | * | 6/1995 | Matthews et al. | 327/63 |
| 5,790,331 A | * | 8/1998 | Aranovsky | 360/46 |
| 6,140,872 A | * | 10/2000 | McEldowney | 330/9 |
| 6,529,043 B1 | * | 3/2003 | Hannan | 326/83 |
| 6,636,098 B1 | * | 10/2003 | Kizer | 327/345 |
| 6,674,377 B1 | * | 1/2004 | Li | 341/120 |
| 6,909,387 B1 | * | 6/2005 | Li | 341/120 |

* cited by examiner

*Primary Examiner*—Peguy Jeanpierre
*Assistant Examiner*—Joseph Lauture
(74) *Attorney, Agent, or Firm*—Vierra Magen Marcus Harmon & DeNiro LLP

(57) ABSTRACT

A circuit, apparatus and method for efficiently and accurately calibrating an output driver current are provided in embodiments of the present invention. In an embodiment of the present invention, a circuit comprises a first digital-to-analog converter ("DAC") that generates a first current. A first transistor is coupled to the first DAC and generates a first biasing current responsive to the first current. A second DAC is coupled to the first transistor and generates a first control current responsive to the first biasing current. According to an embodiment of the present invention, the first and second DACs are binary weighted control DACs. According to an embodiment of the present invention, the binary weighted values of the second DAC are obtained in response to a calibration signal generated by a controller. According to an embodiment of the present invention, the first DAC is an M-bit DAC and the second DAC is an N-bit DAC, wherein M is less than N. According to an embodiment of the present invention, the circuit is in a memory device and a controller generates calibration signals.

20 Claims, 5 Drawing Sheets

CIRCUIT, APPARATUS AND METHOD FOR IMPROVED CURRENT DISTRIBUTION OF OUTPUT DRIVERS ENABLING IMPROVED CALIBRATION EFFICIENCY AND ACCURACY

This application is a continuation of U.S. patent application Ser. No. 10/695,569 filed Oct. 28, 2003 is now a U.S. Pat. No. 6,909,387 (allowed), which is a continuation of U.S. patent application Ser. No. 10/132,246 filed Apr. 25, 2002 (now U.S. Pat. No. 6,674,377).

FIELD OF THE INVENTION

The present invention relates to a circuit, and in particular a circuit for calibrating an output driver current.

BACKGROUND OF THE RELATED ART

In high performance output driver circuits, the output current should be maintained or calibrated to a desirable value. There are a number of ways of calibrating an output current.

First, a desired output current may be obtained through closed-loop continuous calibration. If a binary weighted current control digital-to-analog converter ("DAC") is used, closed-loop continuous time calibration can introduce unacceptable noise into the output current.

Second, a desired output current may be obtained through open-loop discrete time calibration.

Third, a thermometer-coded DAC can be used, but this may introduce large capacitance at a pin. In high-speed link design, minimizing pin capacitance enables improved performance.

Once an appropriate output current is calibrated, distributing information regarding the output current to other output drivers or pins is desirable. Generally, information regarding the calibrated output current can be transferred to other output drivers by a current distribution network using either a current passing or a voltage passing technique.

FIG. 2 illustrates a current distribution network 200 using a current passing technique. An N-bit DAC generates a current to transistors 213–210 in response to n bit values. An N-bit DAC includes N transistors. A biasing current then may be generated to output driver 230. Output driver 230 includes terminal resistors 202 and 203. A biasing current is applied to transistor 209 and transistor 206. Transistors 204 and 205 are coupled to transistor 206. A disadvantage of network 200 is that a calibration time will be too lengthy for a typical current mirror current. Current mirrors formed by transistors 213–210 and 209 and 206 have large resistance capacitance ("RC") time constants for a typical current. In high performance applications, a lengthy calibration time will degrade apparatus or system efficiency.

FIG. 3 illustrates a current distribution network 300 using a voltage passing technique. Output drivers 301 and 302 pass voltage over line 340 and voltage supply $V_{SS}$. Output driver 301 includes terminal resistors 306 and 303 coupled to transistors 304 and 305, respectively. Gates of transistors 310–312 are coupled to line 340 and drains are coupled to transistors 304 and 305. Drains of transistors 313–315 are coupled to the sources of transistors 310–312, respectively, and sources of transistors 313–315 are coupled to voltage source $V_{SS}$. Output driver 302, similar to output driver 301 includes terminal resistors 330 and 331 coupled to transistors 332 and 333. Gates of transistors 320–322 are coupled to line 340 and sources of transistors 320–322 are coupled to transistors 323–325. A disadvantage of network 300 is that there will be pin-to-pin current variations due to current/resistance ("IR") drop on voltage source $V_{SS}$. For example, a voltage drop between a drain of transistor 310 and a source of transistor 313 in output driver 301 will not typically be precisely the same as the voltage drop between a drain of transistor 320 and a source of transistor 323 in output driver 302. As voltage supplies continue to scale down, the transistor gate override will be decreased making this disadvantage worse. Pin-to-pin current variations due to IR drop will be undesirably large for a typical voltage source $V_{SS}$ bus width.

There is also a common disadvantage of networks 200 and 300 shown in FIGS. 2 and 3, respectively. An output driver LSB current is varied greatly due to process/temperature/power supply variations. For example, a current generated by transistors 312 and 315 is considered a LSB current for output driver 301. If a desired output current is I, in a slow process, high temperature and low supply condition, a LSB current is $(I/2^N)$ where N is the number of bits in an N-bit DAC. In a fast process, low temperature and high supply voltage, the LSB current could be several times larger than $(I/2^N)$. This is very undesirable when high accuracy current control is needed to improve system margin.

Therefore, it is desirable to provide a circuit, apparatus and a method for efficiently and accurately calibrating an output driver, and in particular efficiently and accurately calibrating output driver current in a high performance apparatus.

SUMMARY

A circuit, apparatus and method for efficiently and accurately calibrating an output driver are provided in embodiments of the present invention. In an embodiment of the present invention, a circuit comprises a first digital-to-analog converter ("DAC") that generates a first current. A first transistor is coupled to the first DAC and generates a first biasing current responsive to the first current. A second DAC is coupled to the first transistor and generates a first control current responsive to the first biasing current.

According to an embodiment of the present invention, the first and second DACs are binary weighted control DACs.

According to an embodiment of the present invention, the binary weighted value of the second DAC is obtained in response to a calibration signal generated by a controller.

According to an embodiment of the present invention, the first DAC is an M-bit DAC and the second DAC is an N-bit DAC, wherein M is less than N.

According to an embodiment of the present invention, the second DAC is a current source of an output driver.

According to another embodiment of the present invention, the second DAC is coupled to a pin.

According to still another embodiment of the present invention, the first transistor is a p-type transistor. According to an embodiment of the present invention, the binary weighted values are stored in a register.

According to an embodiment of the present invention, the circuit is in a memory device.

According to an embodiment of the present invention, a second transistor is coupled to the first DAC and generates a second biasing current responsive to the first current. A third DAC is coupled to the second transistor and generates a second control current responsive to the second biasing current.

According to an embodiment of the present invention, a current distribution circuit in a memory device comprises a first M-bit DAC generating a first current. A first transistor is coupled to the first M-bit DAC and generates a first biasing current responsive to the first current. A second N-bit DAC is coupled to the first transistor and generates a first control current responsive to the first biasing current. A second transistor is coupled to the first M-bit DAC and generates a second biasing current responsive to the first current. A third N-bit DAC is coupled to the second transistor and generates a second control current responsive to the second biasing current.

According to another embodiment of the present invention, the memory device is a dynamic random access memory ("DRAM") device or a Rambus Dynamic Random Access Memory ("RDRAM") device.

According to an embodiment of the present invention, the first and second transistors are p-type transistors.

According to an embodiment of the present invention, the second DAC is coupled to a first pin and the third DAC is coupled to a second pin.

According to an embodiment of the present invention, an apparatus for calibrating an output driver comprises a controller generating a calibration signal. A device is coupled to the controller and generates an output current in response to the calibration signal. The device includes a circuit having a first M-bit DAC to generate a first current. A first transistor is coupled to the first M-bit DAC and generates a first biasing current responsive to the first current. A second N-bit DAC is coupled to the first transistor and generates a first control current responsive to the first biasing current. A second transistor is coupled to the first M-bit DAC and generates a second biasing current responsive to the first current. A third N-bit DAC is coupled to the second transistor and generates a second control current responsive to the second biasing current.

According to an embodiment of the present invention, a method for calibrating an output driver is provided. M values are provided to an M-bit DAC to generate a first current value. A first biasing current, in response to the first current value, is provided to an N-bit DAC coupled to the output driver. The m most significant bit values of the N-bit DAC is obtained. The m most significant bits are applied to the M-bit DAC to generate a second current value. A second biasing current is provided, in response to the second current, to the N-bit DAC. A control current is obtained for the output driver in response to the second biasing current.

These and other embodiments of the present invention, as well as other aspects and advantages are described in more detail in conjunction with the figures, the detailed description, and the claims that follow.

DETAILED DESCRIPTION

Figure 2:
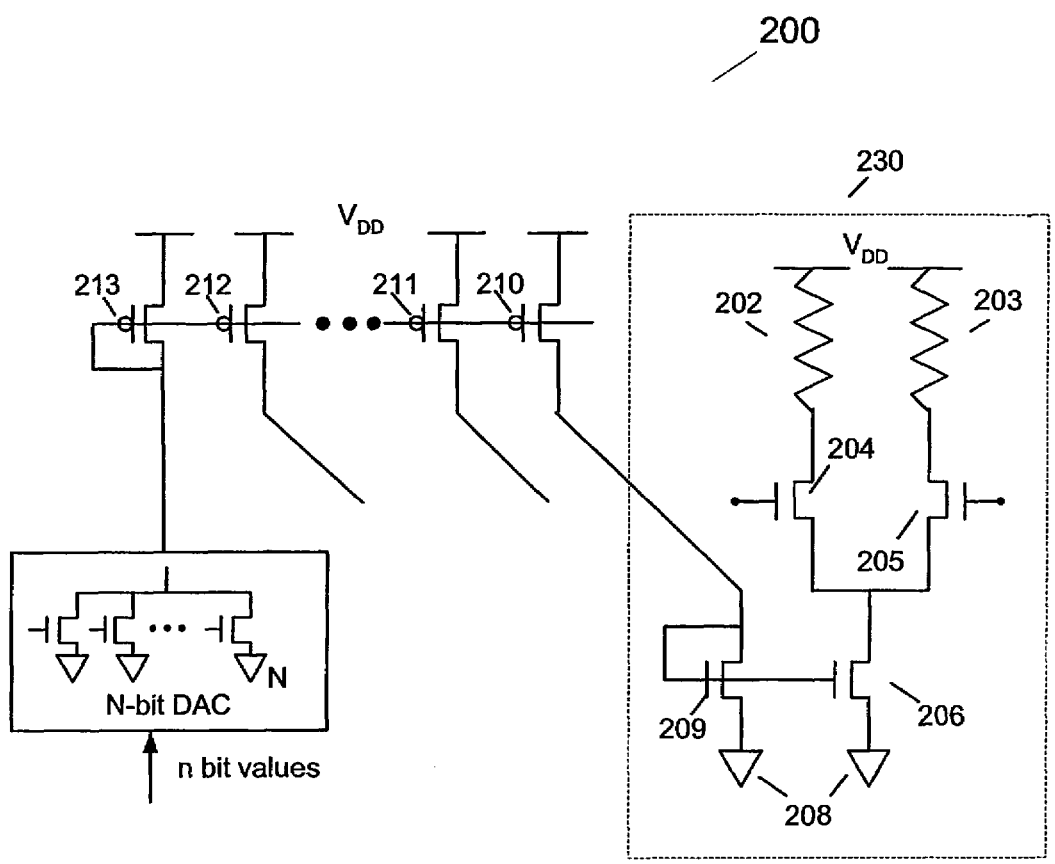
FIG. 2 is a prior art schematic of a current distribution network using a current technique.
Figure 3:
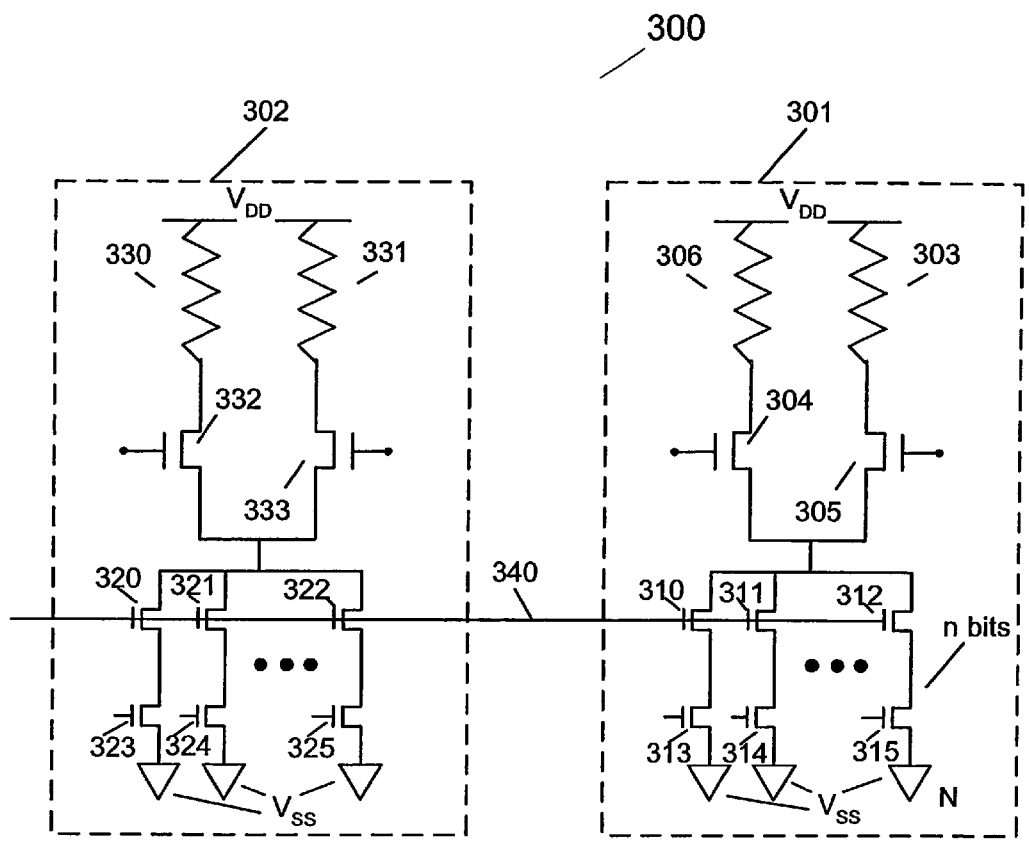
FIG. 3 is a prior art schematic of a current distribution network using a voltage passing technique.
Figure 4:
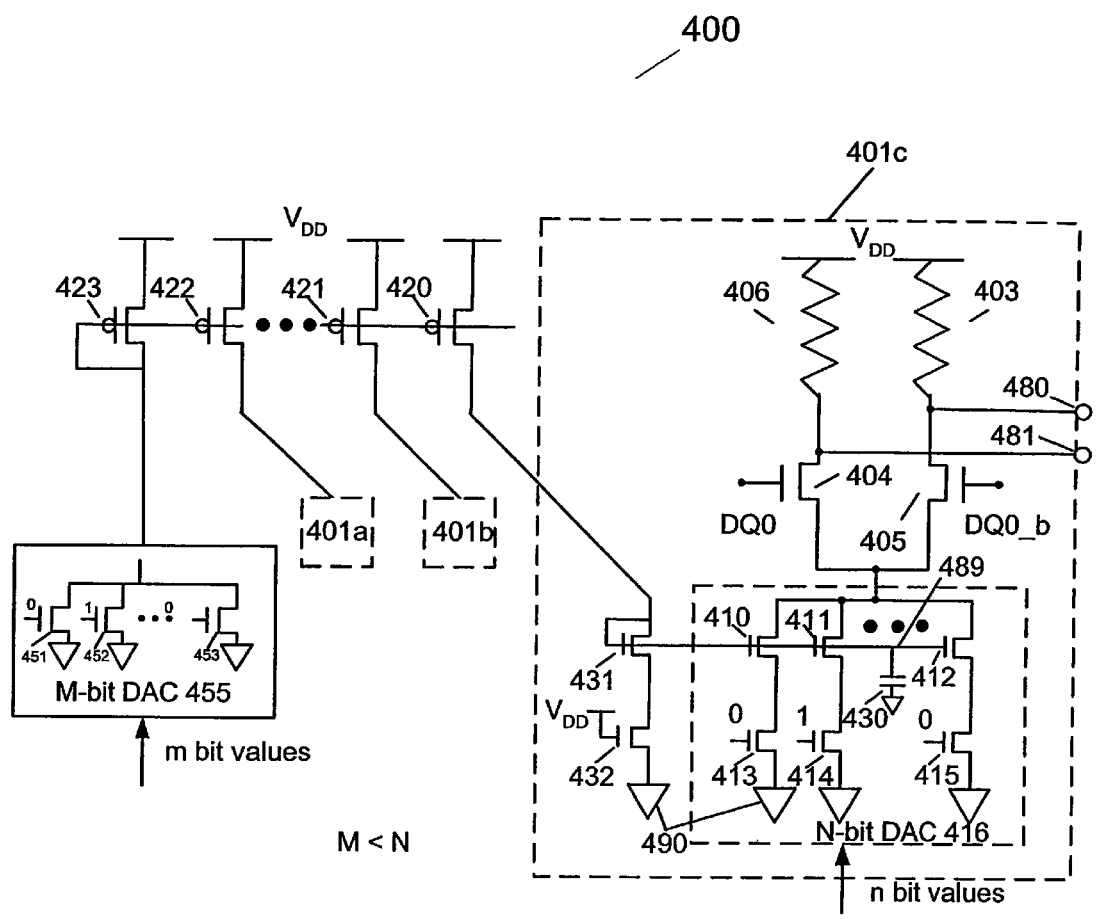
FIG. 4 is a schematic in accordance with an embodiment of the present invention.

FIG. 4 illustrates a circuit 400 according to an embodiment of the present invention. Circuit 400 overcomes many of the disadvantages shown in FIGS. 2 and 3. Circuit 400 provides a current distribution network that combines the advantages of current and voltage passing techniques. Circuit 400 provides biasing currents to output drivers 401a–c from transistors 420–422, thus pin-to-pin variations due to IR drops on a voltage supply $V_{SS}$ is minimized. A current control N-bit DAC is incorporated into an output drivers current source, thus current update time is very fast and allows for minimized calibration time. Also, circuit 400 allows for improved calibration accuracy by reducing the worst-case least significant bit ("LSB") error.

Figure 1:
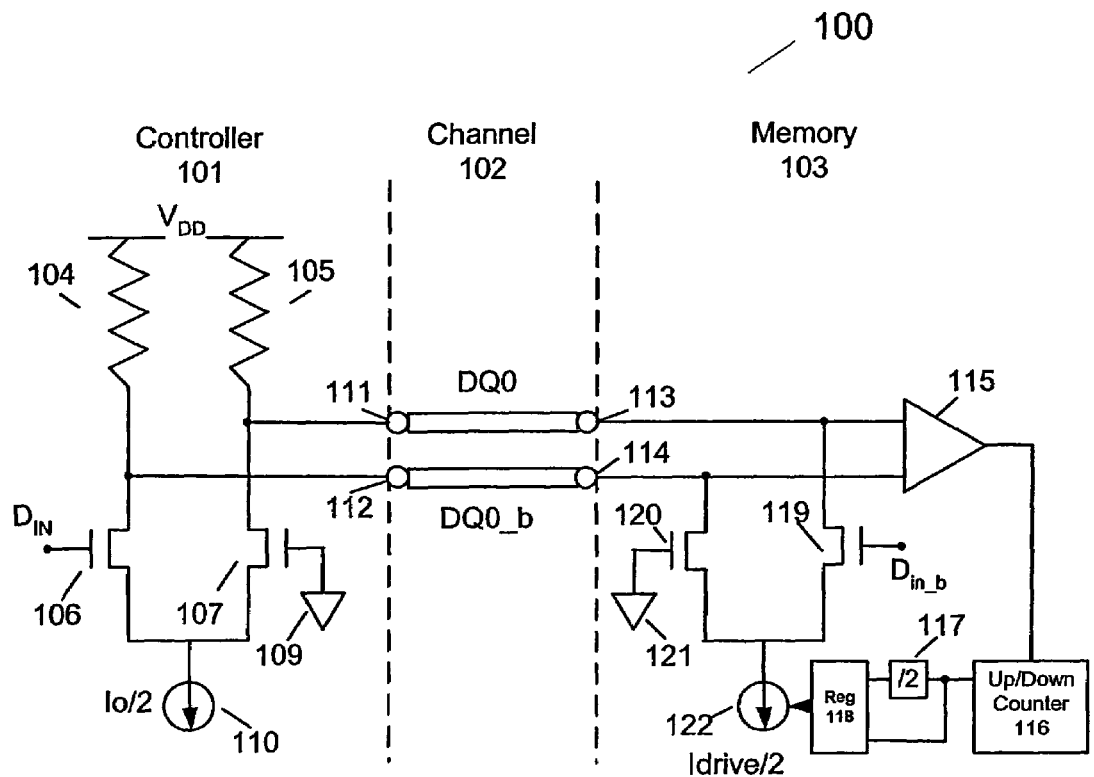
FIG. 1 is a schematic of an apparatus for calibrating an output driver in accordance with an embodiment of the present invention.

Apparatus 100 shown in FIG. 1 illustrates providing calibration signals or current calibration values to memory 103, and in particular to an output driver of memory 103 for calibrating a memory output driver current. Specifically, apparatus 100 obtains an N-bit word, stored in register 118, based on calibration signals from controller 101 that is used to set an N-bit DAC 416 shown in FIG. 4.

Apparatus 100 includes a controller 101, channel 102 and memory 103 in an embodiment of the present invention. Controller 101 is a memory controller and interfaces to channel 102 by pins 111 and 112. In an alternate embodiment of the present invention, multiple memory controller pins are coupled to channel 102 and multiple memory controllers are coupled to channel 102. In an embodiment of the present invention, controller 101 generates signals DQ0 and DQ0_b on pins 111 and 112, respectively, to channel 102.

Memory 103 is coupled to channel 102 by pins 113 and 114. In an embodiment of the present invention, memory 103 is a Dynamic Random Access Memory ("DRAM") device. In an alternate embodiment of the present invention, memory 103 is a Rambus Dynamic Random Access Memory ("RDRAM") device or an equivalent readable and/or writeable memory device. In an embodiment of the present invention, multiple memory pins are coupled to channel 102 and multiple memory devices are coupled to channel 102. In an embodiment of the present invention, signals DQ0 and DQ0_b are received on pins 113 and 114, respectively.

In an embodiment of the present invention, channel 102 is a wire or set of wires for transporting signals. In an embodiment of the present invention, channel 102 is a bidirectional data bus that may carry data information, control information or both. In an alternate embodiment of the present invention, channel 102 is a unidirectional bus.

Controller 101 includes resistor terminals 104 and 105 coupled to voltage source $V_{DD}$. Resistor 104 is also coupled to a drain of n-type transistor 106 and pin 112. Resistor 105 is coupled a drain of n-type transistor 107 and pin 111. Sources of transistors 106 and 107 are coupled to current source 110. A data signal $D_{IN}$ is applied to a gate of transistor 106 and a gate of transistor 107 is coupled to ground 109. In an alternate embodiment of the present invention, a $D_{IN}$ high signal is applied to a gate of transistor 106 while a complementary $Dbar_{IN}$ low signal is applied to a gate of transistor 107. Controller 101 outputs signals DQ0 and DQ0_b on pins 111 and 112, respectively, in response to data signal $D_{IN}$.

Memory 103 includes pins 113 and 114 coupled to inputs of comparator 115. An up/down counter 116 is coupled to an output of comparator 115 and outputs a count value to register 118. A count value is input to a divide-by-2 circuit 117 during calibration. A count value is divided by two because a current output from drains of transistors 120 and 119 during calibration observes twice the impedance as compared to a typical operation mode. An output driver current observes the impedance of channel 102 and controller 101 during calibration. In an embodiment of the present invention, an impedance of channel 102 and controller 101 is approximately the same, for example 50 ohms. An output of a divide-by-2 circuit is input to register 118 during calibration. Register 118 contains a count value or n-bit word used to adjust a current source 122 or calibrate an output current of memory 103, and in particular an output driver current of memory 103 described below. A drain of n-type transistor 120 is coupled to pin 114 and a source of transistor 120 is coupled to current source 122. A gate of transistor 120 is coupled to ground 121. A drain of n-type transistor 119 is coupled to pin 113 and a source of transistor 119 is coupled to current source 122. A data signal $D_{IN\_b}$ is applied to a gate of transistor 119. In an alternate embodiment of the present invention, a $D_{in\_b}$ high signal is applied to a gate of transistor 119 while a complementary $Dbar_{in\_b}$ low signal is applied to a gate of transistor 120.

Controller 101 generates calibration signals DQ0 and DQ0_b on channel 102 to memory 103 in order to calibrate memory 103's output driver current. In particular, FIG. 1 illustrates an open-loop continuous discrete time calibration apparatus 100 that does not introduce unacceptable noise into an output current or introduce large capacitance at pins 113 and 114.

In order to obtain a current calibration value from controller 101, memory 103's load resistance is turned completely off. Drive current source 110, in controller 101, is set to half its nominal value Io/2. Controller 101 drives DQ0_b low. Since memory 103's load is disconnected and the drive current source 110 is halved, DQ0_b will settle to a desired swing. At approximately the same time, memory 103 drives DQ0 load at half current. If DQ0 settles to a higher value than DQ0_b, comparator 115 generates a signal and up/down counter 116 in incremented. Comparator 115 then compares DQ0 and DQ0_b again. This comparison is repeated at least $2^N$ times, which will cause counter 116 to dither around an appropriate current calibration value on n bit values.

In an open-loop discrete time current calibration, calibration time needs to be minimized to improve system efficiency, and least significant bit ("LSB") error needs to be minimized to reduce current output error. Since calibration is only done to one pin and replicated for all pins in a byte, pin-to-pin current variations due to IR drop needs to be minimized to reduce current output error.

Circuit 400 illustrates a current distribution network for transferring calibration information to output drivers in memory 103. Circuit 400 enables efficient and accurate calibration of an output current. In an embodiment of the present invention, a binary weighted control DAC is used to generate a biasing current. In particular, an M-bit DAC 455 generates a biasing current that is distributed to output drivers 401a–c by a current passing technique. In an embodiment of the present invention, output drivers 401a–c also include a binary weighted control DAC and in particular, an N-bit DAC. In an embodiment of the present invention, N is greater than M. In an embodiment of the present invention, a current calibration value or n values (for example, "01 . . . 0" shown on transistors 413, 414 and 415 in FIG. 4) for N-bit DAC 416 and other DACs in output drivers 401a–b are obtained from register 118 shown in FIG. 1. Because a current passing technique is used, pin-to-pin current variations due to IR drop on a voltage source $V_{SS}$ are minimized. M-bit DAC 455 and N-bit DAC 416 are sized such that in a slow process, high temperature and low supply condition a current source of an output driver is in saturation. N-bit DAC 416 provides full output current with all the biasing turned on, for example when transistors 431, 432, 410–412, 413–415 and 451–453 are turned on or alternatively with some error margins when all gates (or bit values) of N-bit DAC are turned on.

A first current is generated from M-bit DAC 455, in memory 103, in response to m digital values applied to an input of M-bit DAC 455. In an embodiment of the present invention, m values of "01 . . . 0" is applied to M-bit DAC 455, and in particular to gates of transistors 451, 452 and 453, in order to generate a current to p-type transistor 423. A drain and gate of transistor 423 is coupled to an output of M-bit DAC 455. Voltage source $V_{DD}$ is coupled to sources of p-type transistors 423–420. Gates of transistors 423–420 are couple to an output of M-bit DAC 455. Drains of transistors 422–420 provide biasing currents to output drivers 401a–c, respectively, in response to current output from M-bit DAC 455.

Output driver 401c includes terminal resistors 406 and 403 coupled to voltage source $V_{DD}$ and to drains of n-type transistors 404 and 405, respectively. An N-bit DAC 416 output is coupled to sources of transistors 404 and 405. Digital n values representing a current calibration value are input to N-bit DAC 416. Drains of transistors 410–412 are coupled to an N-bit DAC output while gates of transistor 410–412 are coupled to a gate of transistor 431. Sources of transistors 410–412 are coupled to drains of n-type transistors 413–415, respectively. Sources of transistor 413–415 are coupled to ground 490.

A drain and gate of n-type transistor 431 is coupled to a drain of transistor 420. A source of transistor 431 is coupled to a drain of n-type transistor 432. A gate of transistor 432 is coupled to voltage source $V_{DD}$ and a source of transistor 432 is coupled to ground 490.

M-bit DAC 455 outputs current of 1X, 2X, 3X . . . $(2^m-1)*X$ in an embodiment of the present invention. Upon power up and reset, M-bit DAC 455 output current is set to $(2^m-1)*X$ in an embodiment of the present invention. N-bit DAC 416 is calibrated based on $(2^m-1)*X$ bias current. After a first calibration pass, a value of m most significant bits of N-bit DAC 416 is stored and used to set the m bit values applied to M-bit DAC 455. At this time, global M-bit DAC 455 outputs bias current that carries process/temperature/voltage conditions of output driver 401c. Bias current variations across different process/temperature/supply conditions are reduced by $2^m-1$ times. So LSB variations of N-bit DAC 416 across different process/temperature/supply conditions are reduced by $2^m-1$ times. After a first calibration pass, global M-bit DAC 455 m bit values are fixed. Current calibration is repeated and N-bit DAC 416 is calibrated a second time using fixed m bit values applied to M-bit DAC 455. Thus, an accurate control current is applied to sources of transistors 404 and 405 and an output current is provided at output driver pins 480 and 481.

Circuit 400 reduces worst-case LSB variations by $2^m-1$ times. If M-bit DAC 455 is not calibrated and it's output current is not adjusted to current process information in output driver 401c, accurate driver output current is not obtained. In a slow process condition, LSB is $(I/2^N)$ where I is a desired output driver 401c current. In a fast process condition, LSB will be $(1+k)*(I/2^N)$, k depends on the process spread and is typically about 1 to 2. Thus, circuit 400 enables a worst-case LSB in a fast process condition to be $(1+k/(2^m-1))*(I/2^N)$. In an embodiment of the present invention, m equals 2.

In a fast process condition, the gate override in a bias line 489 is small compared with a slow process condition. Thus, noise sensitivity is higher in fast process conditions than in slow process conditions. Bypass capacitance 430 is placed in bias line 489 to bypass noise, and sufficient guard rings are put on N-bit DAC current source layout to reduce substrate noise.

In an embodiment of the present invention, an M=2 bit DAC 455 and N=7 bit DAC 416 is used. 2-bit DAC 455 outputs current: 00(1x), 01(2x), 10(3x), 11(4x). After power up and reset, 2-bit DAC 455 is in a 10 state and a DAC 455 output current is set to 3x. After a first pass calibration, if the two most significant bits of 7-bit DAC 416 is calibrated to 11, 11 is used to set 2-bit DAC 455 output current to 4x. If the two most significant bits of 7-bit DAC 416 is calibrated to 10, 10 will be used to set 2-bit DAC 455 output current to 3x. If the two most significant bits of the 7-bit DAC is calibrated to 01, 01 is used to set 2-bit DAC 455 output current to 2x. If the two most significant bits of 7-bit DAC is calibrated to 00, 00 is used to set 2-bit DAC 455 output current to 1x. In an embodiment of the present invention, if k=2 and I=8 mA, LSB is 635 uA in a slow process condition and LSB is 1042 uA in a fast process condition. If circuit 400 is not used, LSB is 1875 uA for a fast process condition. Circuit 400 enables a LSB accuracy improvement of approximately 80%.

Figure 5:
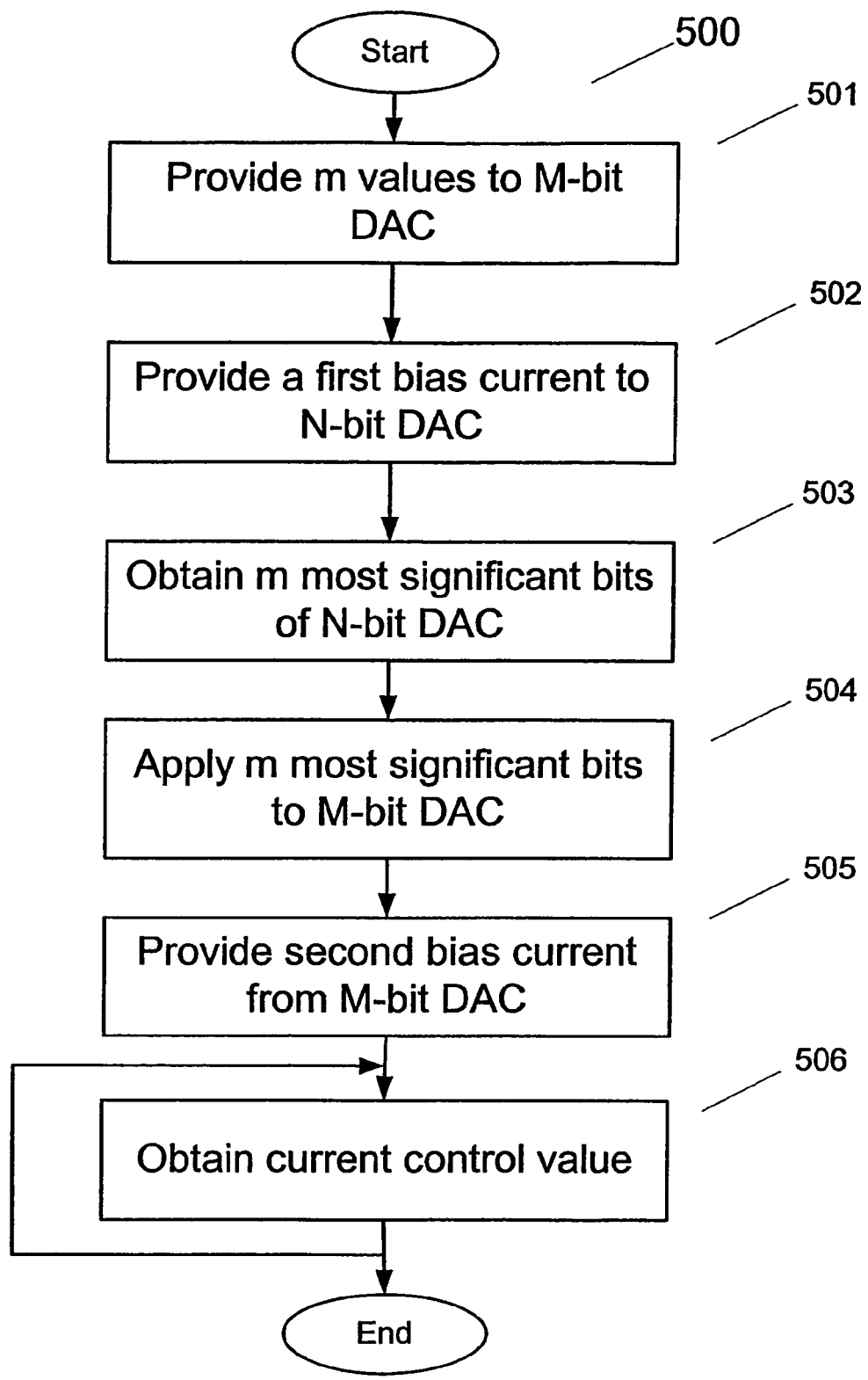
FIG. 5 illustrates a method in accordance with an embodiment of the present invention.

FIG. 5 illustrates a method 500 according to an embodiment of the present invention. In alternate embodiments of the present invention, steps illustrated in FIG. 5 are carried out by hardware, software or a combination thereof. In alternate embodiments, the steps illustrated in FIG. 5 are carried out by the components illustrated in FIGS. 1 and 4. As one of ordinary skill in the art would appreciate, other steps that are not shown may be included in various embodiments of the present invention.

Method 500 begins at step 501 where m values are provided to an M-bit DAC. In an embodiment of the present invention, the m values are provided to M-bit DAC 455, as illustrated in FIG. 4, on power up and reset. M-bit DAC 455 then generates a first current to a drain and gate of transistor 423. A first biasing current is then provided to an output driver in response to the output current from the M-bit DAC as illustrated by logic block 502. In an embodiment of the present invention, a first pass calibration of an output driver is performed by applying a biasing current to output driver 401c. In an embodiment of the present invention, a biasing current is provided from a drain of transistor 420 to a drain and a gate of transistor 431. In an embodiment of the present invention, biasing currents are also provided to output drivers 401a and 401b from drains of transistors 422 and 421, respectively. Output drivers 401a and 401b are illustrated as dashed blocks and have similar components as shown in output driver 401c. The m most significant bit values of an N-bit DAC are obtained as illustrated by logic block 503. These m most significant bit values contain information regarding the present process/temperature/supply condition for an output driver and will be used in a second calibration pass. The m most significant bit values of an N-bit DAC are applied to an M-bit DAC as illustrated in logic block 504. In an embodiment of the present invention, after fixing the m most significant bits from N bit DAC 416 in M-bit DAC 455; a second current from M-bit DAC 455 is applied to a drain and gate of transistor 423. Logic block 505 illustrates generating a second biasing calibration current to an N-bit DAC. In an embodiment of the present invention, a second calibration pass is performed by generating a second biasing calibration current from a drain of transistor 420 to a drain and a gate of transistor 431 in output driver 401c. An accurate and efficient current control value is then obtained for a calibrated output driver 401c as illustrated by logic block 506. In an embodiment of the present invention, a calibrated control current is applied to sources of transistors 404 and 405 in response to the second biasing calibration current being applied to a drain and a gate of transistor 431 and gates of transistors 410–412 in an embodiment of the present invention. Thus, a calibrated output current is provided from an output driver 401c, in particular from drains of transistor 404 and 405, in an efficient and accurate manner. In an embodiment of the present invention, logic block 506 is repeated periodically with the m bit values of M-bit DAC 455 fixed.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A system comprising:
   a controller to output data and control information;
   a device to receive the data and control information, the device including,
      a register to store a first calibration value;
      an output driver to output a signal to the controller, the output driver including a circuit to provide a first current source for the output driver in response to the first calibration value; and
      a current distribution circuit to provide a bias current to the circuit in response to a second calibration value, wherein the second calibration value is derived from the first calibration value.

2. The system of claim 1, wherein the circuit is a first N-bit digital-to-analog converter and the current distribution circuit includes a second M-bit digital-to-analog converter, wherein the first calibration value is an N-bit value and the second calibration value is an M-bit value, wherein M is less than N.

3. The system of claim 2, wherein a plurality of most significant bits of the N-bit value is included in the M-bit value.

4. The system of claim 3, wherein the plurality of most significant bits of the N-bit value replaces the M-bit value that is provided when power is provided to the device.

5. The system of claim 1, wherein the current distribution circuit includes a first transistor to provide the bias current to the circuit in response to the second calibration value.

6. The system of claim 1, wherein the first calibration value is provided to the device from the controller.

7. The system of claim 1, wherein the device is a memory device, wherein the output driver is coupled to a first and a second pin of the memory device, and wherein the first and second pins are coupled to a first and a second resistor, respectively.

8. A system comprising:
a memory controller to provide a first digital calibration value;
a memory device including,
a first output driver to generate a first output signal, the first output driver having a first circuit to provide a first current source for the first output driver in response to the first digital calibration value; and
a second output driver to generate a second output signal, the second output driver having a second circuit to provide a second current source for the second output driver in response to the first digital calibration value; and
a current distribution circuit to provide a bias current to the first and second circuits in response to a second digital calibration value, wherein the second digital calibration value is replaced with bit values from the first digital calibration value.

9. The system of claim 8, wherein the first and second circuits are digital-to-analog converters, respectively.

10. The system of claim 8, wherein the second digital calibration value is initialized when power is provided to the memory device and the second digital calibration value is replaced with bit values from the first digital calibration value during calibration of the memory device.

11. The system of claim 10, wherein the bit values from the first digital calibration value includes a plurality of most significant bits of the first digital calibration value.

12. The system of claim 8, wherein the current distribution circuit includes a first transistor and a second transistor to provide the bias current to the first and second circuits, respectively, in response to the second digital calibration value.

13. The system of claim 8, wherein the first digital calibration value is stored in a register and the first digital calibration value is provided by the memory controller.

14. A system comprising:
a memory controller to provide a first calibration value; and
a memory device including:
a first output circuit including a first digital-to-analog converter to generate a first source current in response to the first calibration value and a first bias current; and
a current distribution circuit to provide the first bias current, wherein the current distribution circuit includes a second digital-to-analog converter to provide a current to a first transistor in response to a second calibration value, wherein the first transistor provides the first bias current.

15. The system of claim 14, wherein the first digital-to-analog converter in an N-bit digital-to-analog converter and the second digital-to-analog converter is a M-bit digital-to-analog converter, wherein M is less than N.

16. The system of claim 14, wherein the memory device includes a second output circuit including a third digital-to-analog converter to generate a second source current in response to the first calibration value and a second bias current, wherein the current distribution circuit includes a second transistor that provides the second bias current in response to the current from the second digital-to-analog converter.

17. The system of claim 14, wherein the first calibration value is a digital value obtained from a register and the second calibration value is digital value that has at least one bit value that is replaced with a bit value from the digital value of the first calibration value.

18. The system of claim 17, wherein the at least one bit value is replaced during a calibration of the first output circuit.

19. The system of claim 14, wherein the first calibration value is provided to a register from the memory controller.

20. The system of claim 14, wherein the memory device is a dynamic random access memory device, and wherein the dynamic random access memory device includes a first pin and a second pin coupled to the first output circuit.

* * * * *